United States Patent
Taylor et al.

(10) Patent No.: US 6,239,973 B1
(45) Date of Patent: *May 29, 2001

(54) EMI CONTAINMENT FOR MICROPROCESSOR CORE MOUNTED ON A CARD USING SURFACE MOUNTED CLIPS

(75) Inventors: Scot W. Taylor, Apache Junction; Robert Starkston, Chandler; Charles Gealer, Phoenix; Michael L. Rutigliano, Chandler; Raymond A. Krick, Gilbert; John A. Rabenius, Tempe; Edmond L. Hart, Chandler; Ravi V. Mahajan, Tempe; Farukh Fares, Phoenix, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/535,424

(22) Filed: Mar. 27, 2000

Related U.S. Application Data

(63) Continuation of application No. 09/098,819, filed on Jun. 17, 1998, now Pat. No. 6,043,983.

(51) Int. Cl.[7] .................................................. H05H 7/20
(52) U.S. Cl. ........................ 361/704; 174/35 GC; 174/51; 361/715; 361/753; 361/816
(58) Field of Search .................................. 165/80.2, 80.3, 165/185; 174/16.3, 35 R, 35 GC, 51; 257/718–719, 726–727, 728; 439/70–73; 361/688, 690, 704, 707–711, 714–722, 753, 760, 783, 799–800, 816, 818, 820

(56) References Cited

U.S. PATENT DOCUMENTS

| | | | |
|---|---|---|---|
| 5,541,811 | * 7/1996 | Henningsson et al. | 361/704 |
| 5,546,278 | * 8/1996 | Bethurum | 361/818 |
| 5,615,085 | * 3/1997 | Wakabayashi et al. | 361/690 |
| 5,659,459 | * 8/1997 | Wakabayashi et al. | 361/816 |

* cited by examiner

Primary Examiner—Gregory Thompson
(74) Attorney, Agent, or Firm—Blakely, Sokoloff, Taylor & Zafman LLP

(57) ABSTRACT

An electronic cartridge which includes a cover that is electrically coupled to a substrate by a clip. An integrated circuit package is mounted to the substrate and at least partially enclosed by the cover. The clips and cover may be connected to a ground plane of the substrate. The cover and substrate may create a "shield" about the integrated circuit package so that any electromagnetic field that flows from the package is grounded to the substrate.

16 Claims, 1 Drawing Sheet

EMI CONTAINMENT FOR MICROPROCESSOR CORE MOUNTED ON A CARD USING SURFACE MOUNTED CLIPS

This is a continuation of U.S. patent application entitled "EMI CONTAINMENT FOR MICROPROCESSOR CORE MOUNTED ON A CARD USING SURFACE MOUNTED CLIPS" (Application No. 09/098,819) filed Jun 17, 1998 which issued as U.S. Pat. No. 6,043,983.

BACKGROUND OF THE INVENTION

1. FIELD OF THE INVENTION

The present invention relates to an electronic cartridge.

2. BACKGROUND INFORMATION

Integrated circuits are typically assembled into packages that are soldered to a printed circuit board. The printed circuit board may be part of a system such as a computer. Each integrated circuit generates heat which must be removed from the package. Some electrical assemblies incorporate a thermal element that is coupled to the integrated circuit package and which provides a thermal path for the heat generated by the integrated circuit.

The integrated circuit may be a relatively high speed device such as a microprocessor. The high switching speeds of a microprocessor may create a relatively strong electromagnetic field that flows from the package. The electromagnetic field may become coupled to other devices within the electrical system. The electro-magnetic coupling may create an unwanted interference in the other electrical circuits and degrade the operation of the system.

The thermal element that is coupled to the integrated circuit package is typically constructed from a material such as copper or aluminum that is both thermally and electrically conductive. Unfortunately, an electrically conductive thermal element may function as an antenna for the electromagnetic field generated by the integrated circuit. It would be desirable to ground the thermal element to reduce the amount of electro-magnetic interference within the system.

SUMMARY OF THE INVENTION

One embodiment of the present invention is an electronic cartridge which includes a cover that is electrically coupled to a substrate by a clip. An integrated circuit package is mounted to the substrate and at least partially enclosed by the cover.

DETAILED DESCRIPTION OF THE INVENTION

One embodiment of the present invention is an electronic cartridge which includes a cover that is electrically coupled to a substrate by a clip. An integrated circuit package is mounted to the substrate and at least partially enclosed by the cover. The clips and cover may be connected to a ground plane of the substrate. The cover and substrate may create a "shield" about the integrated circuit package so that any electro-magnetic field that flows from the package is grounded to the substrate.

Figure 1:
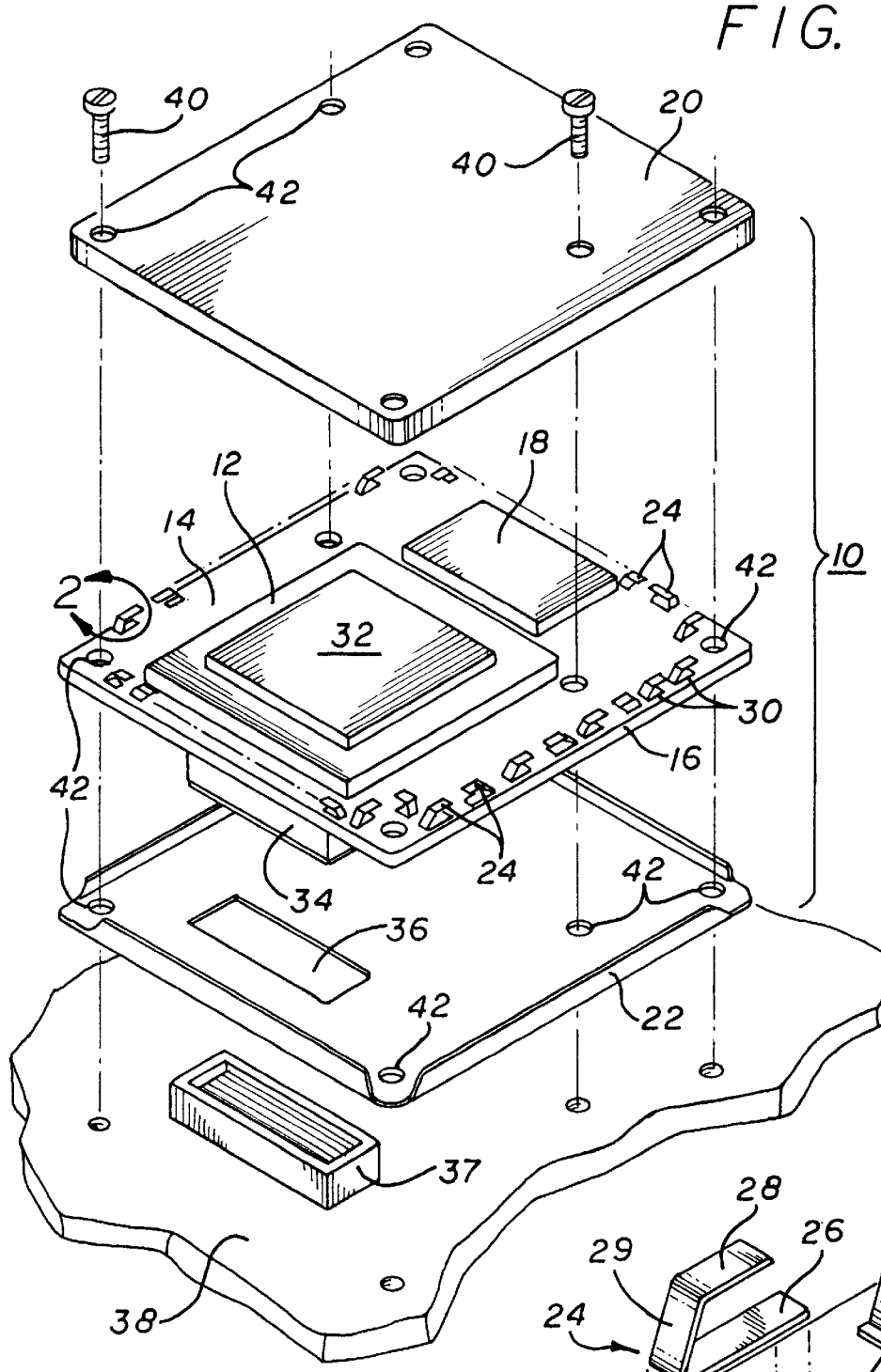
FIG. 1 is a perspective view of an embodiment of an electronic cartridge of the present invention.

Referring to the drawings more particularly by reference numbers, FIG. 1 shows an embodiment of an electronic cartridge 10 of the present invention. The cartridge 10 may include a first integrated circuit package 12 that is mounted to a first side 14 of a substrate 16. The cartridge 10 may also include a second integrated circuit package 18 that is also mounted to the substrate 16. The substrate 16 may be a printed circuit board which has surface pads, routing traces, power/ground planes, vias, etc. as is known in the art.

The cartridge 10 may include a first cover 20 and a second cover 22 that enclose the first 12 and second 18 integrated circuit packages. The covers 20 and 22 are constructed from an electrically conductive material. By way of example, the covers 20 and 22 may be constructed from copper or aluminum.

The first cover 20 may be electrically coupled to the substrate 16 by a plurality of clips 24. The second cover 22 may be connected to the first cover 20 so that both covers 20 and 22 are electrically coupled to the substrate 16. The clips 24 and cover 20 may be coupled to a ground plane of the substrate 16.

The first integrated circuit package 12 may contain a high speed integrated circuit such as a microprocessor which generates an electro-magnetic field. The cover(s) 20 and clips 24 may provide a return path for the electro-magnetic field to the ground plane of the substrate 16. The cover(s) 20 and clips 24 can thus ground any electro-magnetic interference (EMI) which flows from the package 12.

Figure 2:
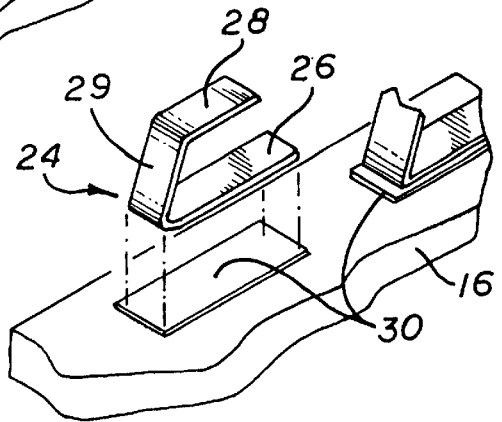
FIG. 2 is a perspective view of a clip attached to a substrate of the cartridge.

FIG. 2 shows an embodiment of a clip 24. The clip 24 may have a mount section 26 that is attached to the substrate 16 and a cantilevered beam section 28 which extends from a base section 29. The clip 24 is constructed from an electrically conductive material such as copper, aluminum or steel. The beam 28 and base 29 sections may be deflected when the cover 20 is coupled to the substrate 16. The base section 29 may be oriented at an oblique angle so that the clip 24 is deflected without buckling the base 29. The beam deflection creates a spring force that pushes the clip 24 into the cover 20. The spring force insures an electrical contact between the cover 20 and the clip 24.

The mount section 26 of each clip 24 may be attached to a corresponding surface pad 30 of the substrate 16. The surface pads 30 may be connected the ground plane of the substrate 16. The clips 24 may be soldered to the surface pads 30. Alternatively, the clips 24 may be attached to the surface pads 30 with an electrically conductive epoxy.

Referring to FIG. 1, the first integrated circuit package 12 may include a metal lid 32 that is thermally coupled to the first cover 20. The lid 32 may be connected to a ground plane of the integrated circuit package 12 so that the cover 20 is also electrically coupled to the package 12. The cartridge 10 may include a thermal grease or epoxy (not shown) that is located between the lid 32 and the cover 20. It may be desirable to fill the grease or epoxy with silver or another electrically conductive material to provide a conductive path between the lid 32 and the cover 20.

The cartridge 10 may include an electrical connector 34 that is mounted to a second side of the substrate 16. The second cover 22 may have an opening 36 which allows the connector 34 to be plugged into a corresponding connector 37 that is mounted to a printed circuit board 38. The cartridge 10 may also have a plurality of fasteners 40 which extend through corresponding clearance holes 42 in the substrate 16 and covers 20 and 22. The fasteners 40 can be screwed into the circuit board 38. The fasteners 40 can be attached to the circuit board 38 in a manner which applies a force that deflects the clips 24.

The cartridge 10 can be assembled by mounting the integrated circuit packages 12 and 18 to the substrate 16. The clips 24 are also attached to the surface pads 30. The clips 24 can be attached in the same solder reflow process that mounts the packages 12 and 18 to the substrate 16.

The covers 20 and 22 can be assembled to enclose the substrate 16 and the packages 12 and 18. The fasteners 40 are then installed to attach the assembly 10 to the circuit board 38. The installation of the fasteners 40 may also press the first cover 20 into the clips 24.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic cartridge, comprising:
    a substrate including a plurality of surface pads situated along each edge of a perimeter of said substrate;
    an integrated circuit package mounted to said substrate;
    a connector attached to a bottom side of said substrate;
    a plurality of electrically conductive covers that fully enclose said integrated circuit package; and,
    a plurality of clips that electrically and thermally couple said plurality of covers to said substrate, each of said plurality of clips being attached to one of the plurality of surface pads.

2. The ridge as recited in claim 1, wherein said clips are deflected by at least one of said plurality of covers.

3. The cartridge as recited in claim 1, wherein each of said plurality of clips has a C-shape.

4. The cartridge as recited in claim 3, wherein said C-shaped clips have a base section that extends at an oblique angle from a mount section.

5. The cartridge as recited in claim 4, wherein said C-shape clips are constructed from an electrically and thermally conductive material such as a copper material.

6. The cartridge as recited in claim 1, wherein said plurality of covers comprise at least a top and a bottom cover with said bottom cover having an opening which fits said connector, and said top cover pressed into said plurality of clips.

7. The electronic cartridge as recited in claim 1, wherein the connector is a plug-in connector for connection with an in-line connector.

8. The electronic cartridge as recited in claim 1, wherein said plurality of surface pads and said plurality of clips are attached to a top surface of said substrate.

9. A method for assembling an electronic cartridge, comprising:
    providing a substrate including plurality of surface pads situated along each edge of a perimeter of said substrate:
    mounting an integrated circuit package to said substrate;
    providing a plurality of electrically conductive covers; and
    electrically and thermally coupling a plurality of clips to said plurality of covers and to said substrate, each of said plurality of clips is attached to one of said plurality of surface pads.

10. The method as recited in, claim 9, wherein each of said plurality of clips is attached to a surface pad of said substrate.

11. The method as recited in claim 9, wherein said top cover is fastened into the substrate and a bottom cover.

12. The method as recited in claim 11, wherein said bottom cover has an opening which fits a plug-in connector attached to a bottom surface of said substrate.

13. The method as recited in claim 9 further comprising:
    coupling an electrically conductive top cover of said plurality of electrically conductive covers to at least one of said plurality of clips to allow said top cover to fully enclose said integrated circuit package; and
    attaching a plug-in connector to a bottom side of said substrate.

14. The method as recited in claim 13, the method further comprising coupling an electrically conductive bottom cover to said substrate, said bottom cover having an opening which fits said plug-in connector.

15. The method as recited in claim 14, wherein said top cover and said bottom cover fully enclose said integrated circuit package.

16. The method as recited in claim 13 wherein said plug-in connector includes a connector that makes connection through a plurality of pins.

* * * * *

UNITED STATES PATENT AND TRADEMARK OFFICE
CERTIFICATE OF CORRECTION

PATENT NO. : 6,239,973 B1
DATED : May 29, 2001
INVENTOR(S) : Taylor et al.

It is certified that error appears in the above-identified patent and that said Letters Patent is hereby corrected as shown below:

Column 3,
Line 29, delete "ridge" and insert -- cartridge --.

Signed and Sealed this

Fifteenth Day of January, 2002

Attest:

JAMES E. ROGAN
*Attesting Officer*     *Director of the United States Patent and Trademark Office*